United States Patent
Alimi et al.

(10) Patent No.: US 7,205,622 B2
(45) Date of Patent: Apr. 17, 2007

(54) VERTICAL HALL EFFECT DEVICE

(75) Inventors: Yousef M. Alimi, Allen, TX (US);
James R. Biard, Richardson, TX (US);
Gilberto Morales, Arlington, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/038,881

(22) Filed: Jan. 20, 2005

(65) Prior Publication Data
US 2006/0157809 A1 Jul. 20, 2006

(51) Int. Cl.
*H01L 29/82* (2006.01)

(52) U.S. Cl. ............... 257/422; 257/426; 257/427; 257/E29.323; 438/48; 324/207.2

(58) Field of Classification Search .......... 257/22, 257/27, 26, 422, 426, 427, E29.323; 438/48; 324/207.2
See application file for complete search history.

(56) References Cited

U.S. PATENT DOCUMENTS

| | | | | |
|---|---|---|---|---|
| 3,800,193 A * | 3/1974 | Ashar et al. | .............. | 257/422 |
| 3,823,354 A * | 7/1974 | Janssen | .............. | 257/427 |
| 3,825,777 A * | 7/1974 | Braun | .............. | 327/511 |
| 4,123,772 A * | 10/1978 | Janssen | .............. | 257/427 |
| 4,141,026 A * | 2/1979 | Bate et al. | .............. | 257/427 |
| 4,660,065 A * | 4/1987 | Carvajal et al. | .............. | 257/426 |
| 4,709,214 A * | 11/1987 | Higgs | .............. | 330/6 |
| 4,829,352 A * | 5/1989 | Popovic et al. | .............. | 257/426 |
| 4,908,527 A * | 3/1990 | Van Antwerp | .............. | 327/511 |
| 4,929,993 A * | 5/1990 | Popovic | .............. | 257/424 |
| 5,179,429 A * | 1/1993 | Ristic | .............. | 257/414 |
| 5,323,050 A | 6/1994 | Ristic | .............. | 257/414 |
| 5,530,345 A | 6/1996 | Murari et al. | .............. | 324/207.2 |
| 5,572,058 A * | 11/1996 | Biard | .............. | 257/421 |
| 5,679,973 A * | 10/1997 | Mochizuki et al. | .............. | 257/421 |
| 6,278,271 B1 * | 8/2001 | Schott | .............. | 324/251 |
| 6,492,697 B1 * | 12/2002 | Plagens et al. | .............. | 257/426 |
| 6,903,429 B2 * | 6/2005 | Berndt et al. | .............. | 257/414 |
| 6,921,955 B2 * | 7/2005 | Goto | .............. | 257/427 |
| 7,015,557 B2 * | 3/2006 | Kilian et al. | .............. | 257/421 |
| 2005/0280107 A1 * | 12/2005 | Cohen | .............. | 257/421 |

\* cited by examiner

*Primary Examiner*—B. William Baumeister
*Assistant Examiner*—Steven J. Fulk
(74) *Attorney, Agent, or Firm*—Kermit D. Lopez; Matthew F. Lambrinos

(57) ABSTRACT

A vertical Hall effect apparatus, including methods thereof. A substrate layer can be provided upon which an epitaxial layer is formed. The epitaxial layer is surrounded vertically by one or more isolation layers. Additionally, an oxide layer can be formed above the epitaxial layer. A plurality of Hall effect elements can be formed within the epitaxial layer(s) and below the oxide layer, wherein the Hall effect elements sense the components of an arbitrary magnetic field in the plane of the wafer and perpendicular to the current flow in the hall element. A plurality of field plates can be formed above the oxide layer to control the inherited offset due to geometry control and processing of the vertical Hall effect apparatus, while preventing the formation of an output voltage of the vertical Hall effect apparatus at zero magnetic fields thereof.

9 Claims, 2 Drawing Sheets

VERTICAL HALL EFFECT DEVICE

TECHNICAL FIELD

Embodiments are generally related to Hall effect elements and devices thereof. Embodiments also relate to Hall effect sensors. Embodiments additionally relate to Hall Effect elements and devices capable of being incorporated into an integrated circuit.

BACKGROUND OF THE INVENTION

For detecting the position of an object, some transducers exploit the Hall effect, whereby, if a conductor material through which current flows in one direction is immersed in a magnetic field directed perpendicular to the current flow direction, across the sensor an electric field is observed perpendicular to both the current and the magnetic field and proportional to the strength of the magnetic field at that point.

Consequently, with known Hall-effect transducers, by measuring the potential difference across the sensor, it is possible to determine the position of a magnetic element (e.g., a permanent magnet or magnetic circuit) whose field pattern is known.

Hall effect elements and devices thereof can be utilized for example, in wattmeters, to measure an electric current $i_N$ or to form a voltage-current cross product $u_N \times i_N$, where, $u_N$ designates the supply voltage of an electric supply system and $i_N$ the electric current used by a consumer of electric energy. Since the current $i_N$ is proportional to the magnetic field $H_N$ it produces, the Hall element indirectly measures the current $i_N$ by determining the magnetic field $H_N$. Since the output voltage $V_H$ of the Hall element is proportional to the product of $i$ and $H_N$, wherein $i$ represents the supply current of the Hall element, the Hall element will also form the voltage-current cross product $u_N \times i_N$, if the supply current $i$ of the Hall element, for instance by means of a resistance, is selected proportionally to the supply voltage $u_N$. In this case the Hall element has to work as a four-quadrant multiplier, as $u_N$ and $i_N$ and also $i$ and $H_N$ are sine-shaped, thus having positive and negative values.

Vertical Hall elements are Hall elements which measure magnetic fields $H_N$ which are oriented parallel to the surface of the Hall element. One example of a vertical Hall effect element is disclosed in U.S. Pat. No. 4,929,993, "Hall Element Device with Depletion Region Protection Barrier," which issued to Popovic et al on May 29, 1990 and which is assigned to Honeywell International Inc. U.S. Pat. No. 4,929,993 is incorporated herein by reference.

U.S. Pat. No. 4,929,993 generally discloses an integrated circuit Hall element in which one or more current connection contacts and two sensor connection contacts are formed on the surface of a semiconductor body incorporating the Hall element. The active zone of the Hall element is located below the surface. A depletion region, depleted of mobile charge, is located between the surface and the active zone to provide isolation for the active zone, so that the Hall device output is linear and independent of changes in external temperature. A feedback circuit is provided to control the thickness of the depletion region.

Another example of a vertical Hall effect element is disclosed in U.S. Pat. No. 5,572,058, "Hall Effect Device Formed in an Epitaxial Layer of Silicon for Sensing Magnetic Fields Parallel to the Epitaxial Layer," which issued to James Biard on Nov. 5, 1996, and which is assigned to Honeywell International Inc. U.S. Pat. No. 5,572,058 is incorporated herein by reference.

U.S. Pat. No. 5,572,058 generally discloses a vertical Hall element formed within the epitaxial layer of a semiconductor and isolated from other components by P-type isolation diffusion. A position defining diffusion is utilized to accurately locate a plurality of openings within the position defining diffusion where contact diffusions are made. The position defining diffusion is made simultaneously with the base diffusion for transistors within the integrated circuit and the contact diffusions are made simultaneously with the emitter diffusion of transistors within the integrated circuit. Five contact diffusions can be provided on the upper surface of the epitaxial layer and generally aligned within the region defined as the Hall element by the isolation diffusions.

The center contact is used to provide electrical current flowing through the Hall effect element. Electrical current is split and flows to the two end contact diffusions. The remaining two contact diffusions are used as sensing contacts and are each placed between the center contact and one of the two end contacts. By using the openings within the base diffusion, the contact diffusions can be accurately located and sized in order to improve the efficiency, sensitivity and accuracy of the vertical Hall element.

Based on the foregoing, it can be appreciated that vertical Hall effect elements implemented in the context of an integrated circuit chip can be utilized to sense the component of magnetic field parallel to the chip. To reduce the lateral size of the contacts by controlling its lateral diffusion, deep P-type diffusion and/or P-type bipolar transistor base diffusion techniques can be implemented. Unfortunately, the lack of uniformity of such diffusion can induce an output voltage at zero fields, along with an offset in addition to an offset due to geometry control and processing.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for improved Hall effect elements and devices thereof.

It is another aspect of the present invention to provide for improved Hall effect elements and devices, which can be implemented in the context of sensing applications.

It is yet another aspect of the present invention to provide for an improved vertical Hall effect device capable of being incorporated into an integrated circuit.

The aforementioned aspects of the invention and other objectives and advantages can now be achieved as described herein. A vertical Hall effect apparatus, including methods thereof, are disclosed. In general, a substrate layer can be provided upon which an epitaxial layer is formed. The epitaxial layer is surrounded vertically by at least one isolation layer. Additionally, an oxide layer can be formed above the epitaxial layer. A plurality of Hall effect elements can be formed within the epitaxial layer and below the oxide layer, wherein the Hall effect senses the components of an arbitrary magnetic field in the plane of the wafer and perpendicular to the current flow in the hall element. Also, a plurality of field plates are formed above the oxide layer to control the inherited offset due to geometry control and processing of the vertical Hall effect apparatus, while preventing the formation of an output spurious voltage of the vertical Hall effect apparatus at zero magnetic fields thereof.

The Hall effect contacts generally comprise N+ type regions formed within the epitaxial layer. The epitaxial layer can be configured as an N-type Hall elements; and two sensing contact, S+ and S−, and two ground contacts can be formed within the epitaxial layer as N+ type regions. A voltage contact (Vcc) can be formed centrally within the epitaxial layer as an N+ type region. The Hall voltage is sensed between the sensing contacts S+, and S−.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
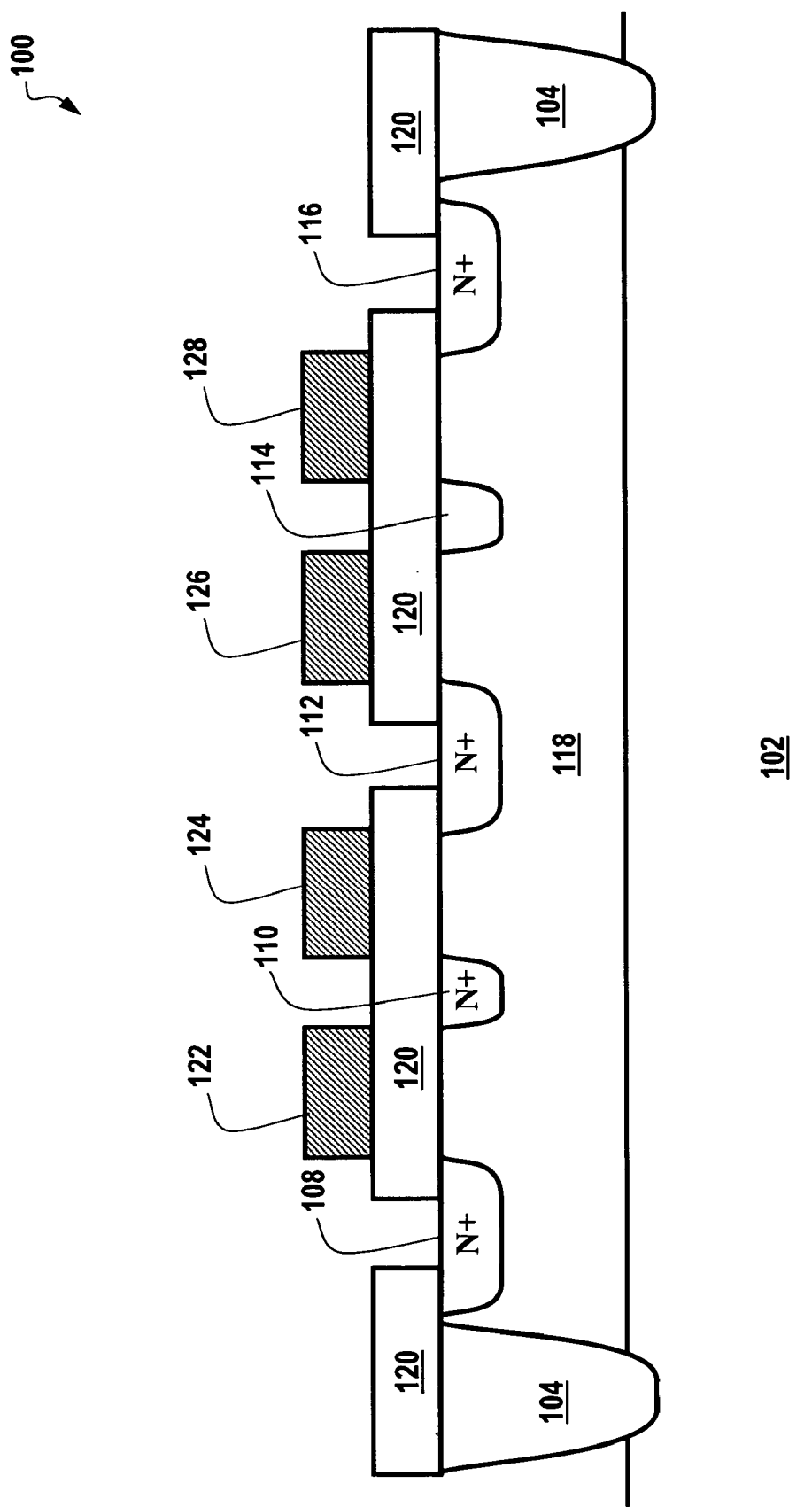
FIG. 1 illustrates a side view of a vertical Hall effect apparatus, which can be implemented in accordance with a preferred embodiment.
Figure 2:
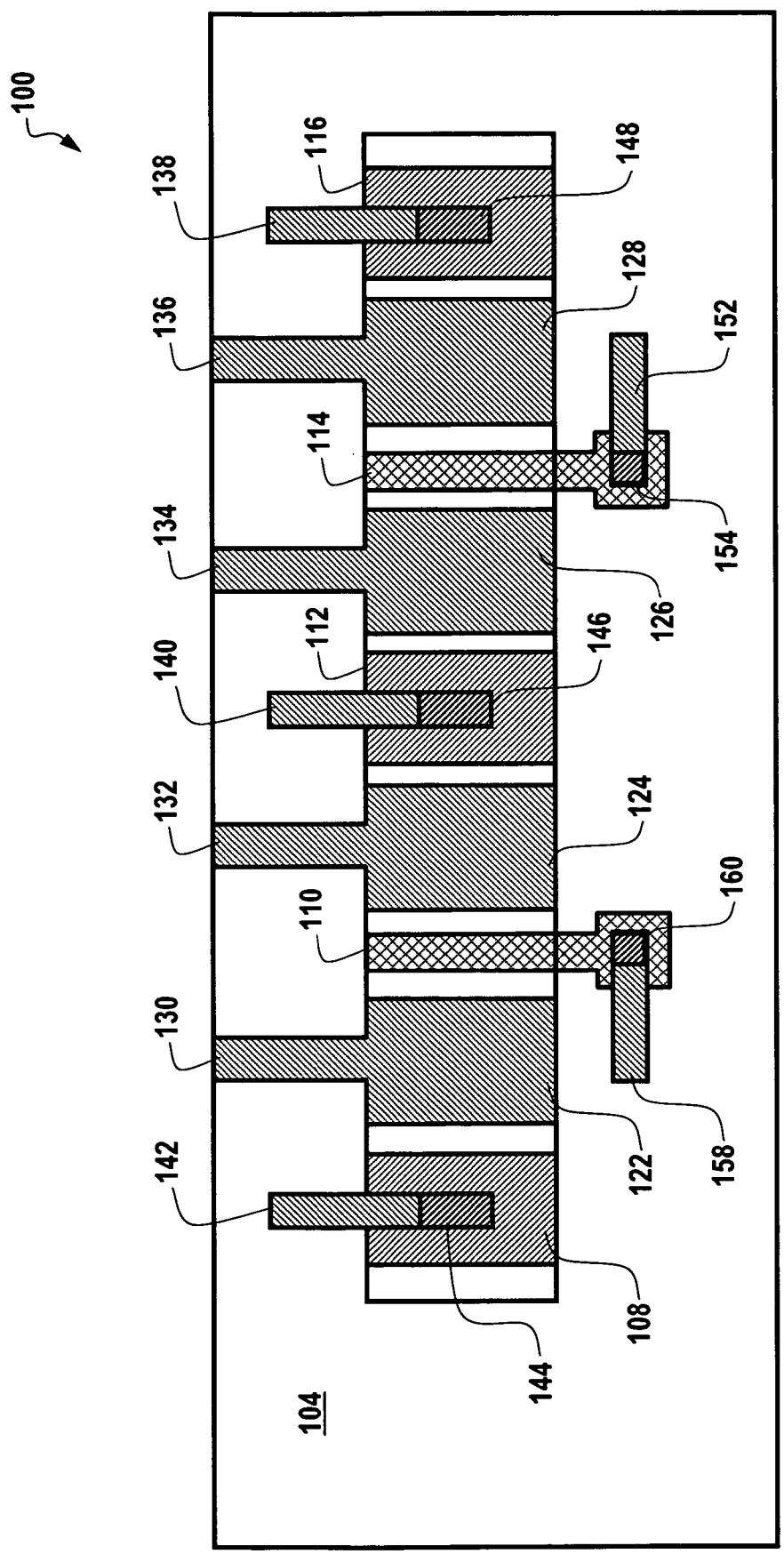
FIG. 2 illustrates a top view of the vertical Hall effect apparatus depicted in FIG. 1 in accordance with a preferred embodiment.

FIG. 1 illustrates a side view of a vertical Hall effect apparatus 100, which can be implemented in accordance with a preferred embodiment. FIG. 2 illustrates a top view of the vertical Hall effect apparatus 100 depicted in FIG. 1 in accordance with a preferred embodiment. Note that in FIGS. 1–2, identical or similar parts are generally indicated by identical reference numerals. FIGS. 1–2 therefore serve to illustrate varying view of the same vertical Hall effect apparatus 100.

Apparatus 100 generally includes a substrate layer 102 upon which an epitaxial layer 118 can be formed. An isolation layer 104 surrounds the epitaxial layer 118 vertically. Additionally, an oxide layer 120 can be formed above the epitaxial layer 118. A plurality of Hall effect elements 110 and 114 (i.e., Hall effect sensing elements) can be formed within the epitaxial layer 118 and below the oxide layer 120, wherein the Hall effect elements 110, 114 sense the components of an arbitrary magnetic field in the plane of the wafer (i.e., substrate layer 102) and perpendicular to the current flow in the hall element.

One or more field plates 122, 124, 126, 128 can be configured above the oxide layer 120. Field plates 122, 124, 126, 128 can be utilized to control the inherited offset due to geometry control and processing of the vertical Hall effect apparatus 100, while preventing the formation of an output voltage associated with the vertical Hall effect apparatus 100 at zero magnetic fields thereof.

The Hall effect sensing contacts 110, 114 can be configured as N+ type regions within the epitaxial layer 118. Note that the epitaxial layer 118 can be configured as an N-type layer. Two ground contacts 108 and 116 can also be formed within the epitaxial layer 118. The ground contacts 108 and 116 can be configured as N+ type regions.

Additionally, a voltage contact 112 (i.e., $V_{CC}$) can be formed centrally within the epitaxial layer 118 between Hall effect sensing contact 110 and Hall effect sensing contact 114. Voltage contact 112 generally comprises an N+ type region. The same magnetic field in the plane of the wafer and perpendicular to the current flow in the hall element will produces a positive voltage on one sensing contacts, and a negative voltage on the other sensing contact.

Vertical Hall effect apparatus 100 can be formed utilizing photolithography techniques in order to reduce the size of associated contacts, while utilizing field plates 122, 124, 126, 128 to control the inherited offset due to variation in geometry control and processing. Unlike past Vertical Hall effect devices, The vertical Hall effect apparatus 100 does not utilize P-type diffusion to control the contact size nor does it utilize P-type diffusion for offset control.

Vertical Hall effect apparatus 100 can be utilized for any number of sensing applications, such as, for example, angle sensing. In generally, a plurality of metal interconnects 130, 132, 134, 136, 138, 140, 142, 152, and 158 can also be provided which connect the vertical Hall effect apparatus 100 to a sensing circuit (not shown in FIGS. 1–2). Additionally a plurality of contact regions 144, 146, 148, 154, and 160 can be provided between metal and N+ regions.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

What is claimed is:

1. A vertical Hall effect apparatus, comprising:
   a substrate layer upon which an epitaxial layer is formed, wherein said epitaxial layer is surrounded vertically by an isolation layer and wherein an oxide layer is formed above said epitaxial layer;
   a plurality of adjacent contacts arranged side by side in a row within said epitaxial layer and separated by regions of said epitaxial layer; wherein said plurality of contacts comprise:
   a pair of Hall effect sensing contacts formed below said oxide layer, wherein said pair of Hall effect sensing contacts senses the components of an arbitrary magnetic field in a plane of said substrate and perpendicular to a current flow in at least one Hall effect sensing contact among said pair of Hall effect sensing contacts, and;
   a voltage contact (Vcc) formed centrally within said epitaxial layer between said pair of Hall effect sensing contacts; and
   a pair of ground contacts formed outwardly within said epitaxial layer, each of said ground contacts being located adjacent respective Hall effect sensing contacts; and
   a plurality of field plates formed above said oxide layer, wherein each of said plurality of field plates is located above a respective one of said epitaxial regions and between a respective immediately adjacent pair of said plurality of contacts such that said plurality of field plates control an inherited offset due to geometry control and processing of said vertical Hall effect apparatus, while preventing the formation of an output voltage of said vertical Hall effect apparatus at zero magnetic fields thereof.

2. The apparatus of claim 1 wherein said pair of Hall effect sensing contacts comprises a lightly doped N-epitaxial material.

3. The apparatus of claim 1 wherein said pair of ground contacts comprise N+ type regions.

4. The apparatus of claim 1 wherein one of said Hall effect sensing contacts among said pair of Hall effect sensing contacts produces a positive voltage in response to a magnetic field, thereby providing a voltage-sensing component thereof.

5. The apparatus of claim 4 wherein said voltage sensing component comprises an N+ type region.

6. The apparatus of claim 1 wherein one of said Hall effect sensing contacts among said pair of Hall effect sensing contacts produces a negative voltage in response to a magnetic field, thereby providing a voltage-sensing component thereof.

7. The apparatus of claim 6 wherein said voltage sensing component comprises an N+ type region.

8. The apparatus of claim 1 wherein said voltage contact comprises an N+ type region.

9. A vertical Hall effect apparatus, comprising:
   a substrate layer upon which an N-type epitaxial layer is formed, wherein said epitaxial layer is surrounded vertically by an isolation layer and wherein an oxide layer is formed above said N-type epitaxial layer;
   a plurality of adjacent contacts arranged side by side in a row within said N-type epitaxial layer and separated by regions of said N-type epitaxial layer; wherein said plurality of contacts comprise;
   pair of Hall effect sensing contacts formed as N+ type regions within said N-type epitaxial layer and below said oxide layer, wherein said pair of Hall effect sensing contacts sense the components of an arbitrary magnetic field in the plane of the substrate and perpendicular to the current flow in the hall sensing contact, wherein one of said Hall effect sensing contacts among said pair of Hall effect sensing contacts provides a positive sense voltage and the other of said Hall effect sensing contacts among said pair of Hall effect sensing contacts provides a negative sense voltage in response to a magnetic field
   a voltage contact (Vcc) formed centrally within said N-type epitaxial layer between said pair of Hall effect sensing contacts; and
   a pair of rround contacts formed outwardly within said N-type epitaxial layer, each of said ground contacts being located adjacent respective Hall effect sensing contacts; and
a plurality of field plates formed above said oxide layer, wherein each of said plurality of field plates is located above a respective one of said epitaxial regions and between a respective immediately adjacent pair of said plurality of contacts such that said plurality of field plates control an inherited offset due to geometry control and processing of said vertical Hall effect apparatus, while preventing the formation of an output voltage of said vertical Hall effect apparatus at zero magnetic fields thereof.

\* \* \* \* \*

UNITED STATES PATENT AND TRADEMARK OFFICE
CERTIFICATE OF CORRECTION

| | | |
|---|---|---|
| PATENT NO. | : 7,205,622 B2 | Page 1 of 1 |
| APPLICATION NO. | : 11/038881 | |
| DATED | : April 17, 2007 | |
| INVENTOR(S) | : Yousef M. Alimi et al. | |

It is certified that error appears in the above-identified patent and that said Letters Patent is hereby corrected as shown below:

In Column 6, line 3, add --a-- before the word "pair";
In Column 6, line 20, delete "rround" and add --ground--.

Signed and Sealed this

Twenty-third Day of October, 2007

JON W. DUDAS
*Director of the United States Patent and Trademark Office*